US012550567B2

(12) United States Patent
Wang et al.

(10) Patent No.: US 12,550,567 B2
(45) Date of Patent: Feb. 10, 2026

(54) DISPLAY SUBSTRATE HAVING GRID-LIKE ANTENNA OVER HOLLOWED-OUT PORTION, MANUFACTURING METHOD AND DISPLAY DEVICE HAVE THE SAME

(71) Applicants: Beijing BOE Technology Development Co., Ltd., Beijing (CN); BOE Technology Group Co., Ltd., Beijing (CN)

(72) Inventors: Feng Wang, Beijing (CN); Jian Zhou, Beijing (CN); Yanzhao Li, Beijing (CN); Feng Qu, Beijing (CN)

(73) Assignees: BEIJING BOE TECHNOLOGY DEVELOPMENT CO., LTD, Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 587 days.

(21) Appl. No.: 17/923,660

(22) PCT Filed: Nov. 25, 2021

(86) PCT No.: PCT/CN2021/133293
§ 371 (c)(1),
(2) Date: Nov. 7, 2022

(87) PCT Pub. No.: WO2023/092425
PCT Pub. Date: Jun. 1, 2023

(65) Prior Publication Data
US 2024/0155900 A1 May 9, 2024

(51) Int. Cl.
*H10K 59/131* (2023.01)
*H01Q 1/36* (2006.01)
(Continued)

(52) U.S. Cl.
CPC .......... *H10K 59/1315* (2023.02); *H01Q 1/36* (2013.01); *H10K 59/1201* (2023.02); *H10K 59/40* (2023.02); *H10K 59/873* (2023.02)

(58) Field of Classification Search
CPC .......... H01K 59/1315; H10K 59/1201; H10K 59/40; H10K 59/873; H01Q 1/36
See application file for complete search history.

(56) References Cited

U.S. PATENT DOCUMENTS 10,734,710 B1 * 8/2020 Navarro ............... H01Q 21/205
2013/0050038 A1 * 2/2013 Eom ..................... H01Q 5/392
343/866

(Continued)

*Primary Examiner* — Michael Jung
(74) *Attorney, Agent, or Firm* — WHDA, LLP

(57) ABSTRACT

A display substrate includes a base substrate, a voltage line arranged at a peripheral region of the base substrate, an encapsulation layer arranged at a side of the voltage line away from the base substrate, and a plurality of pixel units arranged at a display region of the base substrate. The encapsulation layer is arranged at a part of the display region and the peripheral region of the base substrate. The display substrate further includes an antenna arranged at a side of the encapsulation layer away from the base substrate, the antenna is a grid-like antenna, the voltage line is provided with a hollowed-out portion, and an orthogonal projection of at least a part of an end of the antenna onto the base substrate is located within an orthogonal projection of the hollowed-out portion onto the base substrate.

19 Claims, 14 Drawing Sheets

(51) Int. Cl.
*H10K 59/12* (2023.01)
*H10K 59/40* (2023.01)
*H10K 59/80* (2023.01)

(56) References Cited

U.S. PATENT DOCUMENTS

| | | | |
|---|---|---|---|
| 2013/0127672 A1* | 5/2013 | Zhu | H01Q 1/2266 343/866 |
| 2014/0078008 A1* | 3/2014 | Kang | H01Q 5/35 343/702 |
| 2018/0123242 A1* | 5/2018 | Jeon | H01Q 5/30 |
| 2020/0395661 A1* | 12/2020 | Bai | H01Q 21/28 |
| 2021/0200379 A1* | 7/2021 | Youk | G06F 3/0443 |
| 2022/0029280 A1* | 1/2022 | Huh | H01Q 1/364 |

* cited by examiner

DISPLAY SUBSTRATE HAVING GRID-LIKE ANTENNA OVER HOLLOWED-OUT PORTION, MANUFACTURING METHOD AND DISPLAY DEVICE HAVE THE SAME

TECHNICAL FIELD

The present disclosure relates to the field of display technology, in particular to a display substrate, a manufacturing method, and a display device. This application is the U.S. national phase of PCT Application No. PCT/CN2021/133293 filed on Nov. 25, 2021, which is incorporated herein by reference in its entirety.

BACKGROUND

In the related art, an on-screen antenna scheme mainly includes forming an antenna on a flexible thin film and then attaching the flexible thin film onto a display screen. For a bonding process, it is impossible to achieve accurate alignment in a semiconductor process, so each pixel unit of the display screen is easy to be shielded obviously, and dark stripes and Moire patterns easily occur. In addition, in order to alleviate an effect caused by a decrease in an optical transmittance at an antenna region, a similar grid-like pattern also needs to be formed at a non-antenna functional region, and at this time, a transmittance of the entire display screen is decreased by 5% to 20%. Furthermore, when the antenna is integrated directly on an encapsulation layer, the accurate alignment in the semiconductor process may be achieved. However, due to a distance of about 10 μm between the encapsulation layer and a cathode layer, there is radiation efficiency of merely about 2.8% depending on a microstrip patch radiation theory, so it is substantially impossible to form the antenna directly through photoetching.

SUMMARY

In one aspect, the present disclosure provides in some embodiments a display substrate, including a base substrate, a voltage line arranged at a peripheral region of the base substrate, an encapsulation layer arranged at a side of the voltage line away from the base substrate, and a plurality of pixel units arranged at a display region of the base substrate. The encapsulation layer is arranged at the peripheral region and the display region of the base substrate. The display substrate further includes an antenna arranged at a side of the encapsulation layer away from the base substrate, the antenna is a grid-like antenna, the voltage line is provided with a hollowed-out portion, and an orthogonal projection of at least a part of an end of the antenna onto the base substrate is located within an orthogonal projection of the hollowed-out portion onto the base substrate.

In a possible embodiment of the present disclosure, the voltage line includes a first voltage line portion, a second voltage line portion, a third voltage line portion and a fourth voltage line portion, the first voltage line portion is arranged at a first side of the display region, the second voltage line portion is arranged at a second side of the display region, the third voltage line portion is arranged at a third side of the display region, the fourth voltage line portion is arranged at a fourth side of the display region, the first side is opposite to the second side, the third side is opposite to the fourth side, the first side is adjacent to the third side, the second side is adjacent to the third side, a driving integrated circuit is arranged at the fourth side of the display region, and the hollowed-out portion is arranged on at least one of the first voltage line portion, the second voltage line portion and the third voltage line portion.

In a possible embodiment of the present disclosure, the peripheral region includes a voltage line region and an encapsulation region, the voltage line region is arranged at a side of the encapsulation region adjacent to the display region, the voltage line is arranged at the voltage line region, the voltage line is a cathode voltage line, the display substrate includes a first driving circuit region arranged at the first side of the display region and a second driving circuit region arranged at the second side of the display region, the cathode voltage line includes a first cathode voltage line portion, a second cathode voltage line portion, and a third cathode voltage line portion arranged at the third side of the display region, the first cathode voltage line portion is arranged between the encapsulation region and the first driving circuit region, the second cathode voltage line portion is arranged between the encapsulation region and the second driving circuit region, and the hollowed-out portion is arranged on at least one of the first cathode voltage line portion, the second cathode voltage line portion and the third cathode voltage line portion.

In a possible embodiment of the present disclosure, the hollowed-out portion is a rectangular hollowed-out portion, and a first long side and a second long side of the hollowed-out portion extend in an extension direction of the voltage line.

In a possible embodiment of the present disclosure, an absolute value of a difference between a shortest distance between the orthogonal projection of at least a part of the end of the antenna onto the base substrate and the first long side of the hollowed-out portion and a shortest distance between the orthogonal projection of at least a part of the end of the antenna onto the base substrate and the second long side of the hollowed-out portion is smaller than or equal to a distance difference threshold, and the distance difference threshold is greater than or equal to 0 and smaller than or equal to 3 μm.

In a possible embodiment of the present disclosure, the antenna has a plurality of ends, orthogonal projections of the ends onto the base substrate are located within an orthogonal projection of one hollowed-out portion onto the base substrate, and a length of a long side of the hollowed-out portion is greater than or equal to $\lambda/2n$, where $\lambda$ is a wavelength corresponding to a radiation frequency of the antenna, and $n$ is a refractive index of the encapsulation layer.

In a possible embodiment of the present disclosure, the antenna has N ends, the voltage line has N hollowed-out portions, and an orthogonal projection of an $n^{th}$ end of the N ends onto the base substrate is located within an orthogonal projection of an n hollowed-out portion of the voltage line onto the base substrate, where N is an integer greater than 1, and n is a positive integer smaller than or equal to N. A length of a long side of each hollowed-out portion is greater than or equal to $\lambda/2n$, where $\lambda$ is a wavelength corresponding to a radiation frequency of the antenna, and n is a refractive index of the encapsulation layer.

In a possible embodiment of the present disclosure, the antenna has a plurality of ends, an orthogonal projection of one end in the plurality of ends onto the base substrate is located within an orthogonal projection of one hollowed-out portion onto the base substrate, and a length of a long side of the hollowed-out portion is greater than or equal to $\lambda/2n$, where $\lambda$ is a wavelength corresponding to a radiation frequency of the antenna, and n is a refractive index of the encapsulation layer.

In a possible embodiment of the present disclosure, the voltage line portion with the hollowed-out portion has an equal line width.

In a possible embodiment of the present disclosure, the hollowed-out portion extends in a first direction, a second direction and a third direction are perpendicular to the first direction, the second direction is opposite to the third direction, and the voltage line portion is provided with a first protrusion protruding toward the second direction so that the voltage line with the hollowed-out portion has an equal line width.

In a possible embodiment of the present disclosure, the hollowed-out portion extends in a first direction, a second direction and a third direction are perpendicular to the first direction, the second direction is opposite to the third direction, and the voltage line portion is provided with a second protrusion protruding toward the third direction so that the voltage line with the hollowed-out portion has an equal line width.

In a possible embodiment of the present disclosure, the hollowed-out portion extends in a first direction, a second direction and a third direction are perpendicular to the first direction, the second direction is opposite to the third direction, and the voltage line portion is provided with a first protrusion protruding toward the second direction and a second protrusion protruding toward the third direction so that the voltage line with the hollowed-out portion has an equal line width.

In a possible embodiment of the present disclosure, the voltage line portion with the hollowed-out portion has a line width of A, and a length of a short side of the hollowed-out portion is smaller than or equal to A/4.

In a possible embodiment of the present disclosure, the plurality of pixel units in the display substrate is arranged in an array form, the display substrate further includes a plurality of gate lines and a plurality of data lines arranged at the display region of the base substrate, each gate line extends in a first direction, and each data line extends in a second direction. Two pixel units closest to each other in two rows of pixel units are arranged in the second direction, and the antenna is a U-shaped antenna or an E-shaped antenna; or the two pixel units closest to each other in two rows of pixel units are arranged in a third direction different from the second direction and the first direction, and the antenna is a chamfered diamond antenna.

In a possible embodiment of the present disclosure, the antenna is an L-shaped antenna, the antenna includes a first end and a second end, the voltage line is provided with a first hollowed-portion and a second hollowed-out portion, an orthogonal projection of the first end onto the base substrate is located within an orthogonal projection of the first hollowed-out portion onto the base substrate, an orthogonal projection of the second end onto the base substrate is located within an orthogonal projection of the second hollowed-out portion onto the base substrate, and the first hollowed-out portion and the second hollowed-out portion are arranged at two adjacent sides of the voltage line respectively.

In a possible embodiment of the present disclosure, the antenna is a rectangular or T-shaped antenna, the voltage line is provided with a first hollowed-out portion, and an orthogonal projection of one end of the antenna onto the base substrate is located within an orthogonal projection of the first hollowed-out portion onto the base substrate.

In a possible embodiment of the present disclosure, the display substrate further includes a touch layer arranged at a side of the encapsulation layer away from the base substrate, the antenna is arranged at a side of the touch layer away from the encapsulation layer, the display substrate further includes an insulation layer arranged between the touch layer and the antenna, and an orthogonal projection of the insulation layer onto the base substrate covers an orthogonal projection of the antenna onto the base substrate.

In a possible embodiment of the present disclosure, the touch layer comprises a plurality of touch units arranged in rows and columns, the touch units are provided with a plurality of touch signal lines, a touch signal line in a touch unit overlapping the antenna in the plurality of touch units has a line width greater than a line width of a touch signal line in a touch unit not overlapping the antenna in the plurality of touch units, and a quantity of breaking points in the touch signal line in the touch unit overlapping the antenna in the plurality of touch units is smaller than a quantity of breaking points in the touch signal line in the touch unit not overlapping the antenna in the plurality of touch units.

In another aspect, the present disclosure provides in some embodiments a method for manufacturing the above-mentioned display substrate, including: forming a plurality of pixel units at a display region of a base substrate, and forming a voltage line at a peripheral region of the base substrate, the voltage line being provided with a hollowed-out portion; forming an encapsulation layer at a side of the voltage line away from the base substrate; and directly forming a grid-like antenna at a side of the encapsulation layer away from the base substrate in such a manner that an orthogonal projection of at least a part of an end of the grid-like antenna onto the base substrate is located within an orthogonal projection of the hollowed-out portion onto the base substrate.

In yet another aspect, the present disclosure provides in some embodiments a display device including the above-mentioned display substrate.

DETAILED DESCRIPTION

Figure 1:
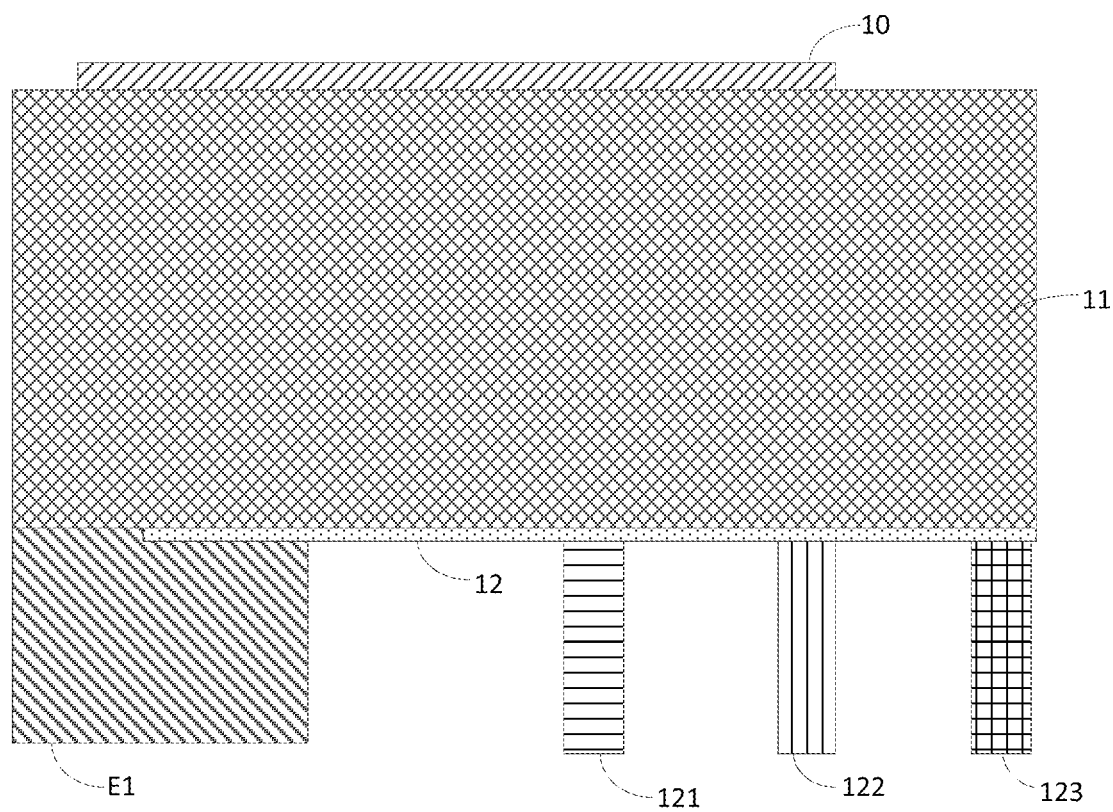
FIG. 1 is a partial sectional view of a display substrate according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of the embodiments of the present disclosure, and based on these embodiments, a person skilled in the art may, without any creative effort, obtain the other embodiments, which also fall within the scope of the present disclosure.

The present disclosure provides in some embodiments a display substrate which includes a base substrate, a voltage line arranged at a peripheral region of the base substrate, an encapsulation layer arranged at a side of the voltage line away from the base substrate, and a plurality of pixel units arranged at a display region of the base substrate. The encapsulation layer is arranged at the peripheral region and the display region of the base substrate. The display substrate further includes an antenna arranged at a side of the encapsulation layer away from the base substrate, the antenna is a grid-like antenna, the voltage line is provided with a hollowed-out portion, and an orthogonal projection of at least a part of an end of the antenna onto the base substrate is located within an orthogonal projection of the hollowed-out portion onto the base substrate.

According to the embodiments of the present disclosure, the display substrate includes the antenna arranged at a side of the encapsulation layer away from the base substrate, and the antenna is of a grid-like structure, so as to not shield the pixel units, thereby to prevent a display effect from being adversely affected and improve the light transmittance. In addition, in the embodiments of the present disclosure, the voltage line is provided with the hollowed-out portion, no conductive material is provided at the hollowed-out portion, and the orthogonal projection of at least a part of the end of the antenna onto the base substrate is located within the orthogonal projection of the hollowed-out portion onto the base substrate. The voltage line is arranged at the peripheral region of the base substrate, and above and under the voltage line, there are regions not shielded by a metal layer, so it is able to provide the voltage line with the hollowed-out portion conveniently, thereby to improve the radiation efficiency.

In the related art, an antenna is arranged on the display region, and in order to ensure uniform optical transparency at both a non-antenna region and an antenna region, a metal grid also needs to be formed at the non-antenna region, resulting in a decrease in the optical transmittance of an entire display screen. However, for the antenna in the display substrate in the embodiments of the present disclosure, it is unnecessary to provide any metal grid in the non-antenna region to alleviate a visual effect caused due to the non-uniform transparency. As a result, it is able to improve the optical transmittance and enable the optical transmittance to be greater than 95%, thereby to substantially prevent light generated by the pixel unit from being shielded.

In at least one embodiment of the present disclosure, the pixel unit is, but not limited to, an Organic Light-Emitting Diode (OLED) pixel unit.

In a conventional antenna, in order to prevent the occurrence of dark stripes and Moire patterns as possible, a metal line in a metal grid needs to be processed to be smaller than 2.5 µm, so for a conventional glass-based process, it is very difficult to form the metal line and more process steps are required, resulting in an increase in the manufacture cost and a decrease in the yield. In at least one embodiment of the present disclosure, the antenna is made of a metallic material having high conductivity. e.g., copper, aluminum or silver. The antenna has a line width greater than 5 µm, and as compared with the related art where the line width of the antenna needs to be smaller than or equal to 2.0 µm, it is able to remarkably reduce the difficulty in the manufacture.

In at least one embodiment of the present disclosure, an orthogonal projection of the antenna onto the base substrate includes a first portion arranged at the display region. The first portion is arranged between orthogonal projections of adjacent pixel units onto the base substrate, so as not to shield the pixel unit, thereby to improve the light transmittance.

In a possible embodiment of the present disclosure, the voltage line is, but not limited to, a cathode voltage line.

In at least one embodiment of the present disclosure, the cathode voltage line is a line electrically coupled to a cathode of an OLED in the pixel unit.

As shown in FIG. 1, an antenna layer 10 is arranged at a side of the encapsulation layer 11 away from the voltage line E1, and the voltage line E1 is lapped onto a cathode layer 12 so as to provide a voltage signal for the cathode layer 12 (in FIG. 1, the voltage line is a cathode voltage line, and a direct-current voltage signal is a low level signal). The antenna layer 10 extends to the display region, and the pixel units are arranged at the display region. In FIG. 1, 121 represents a red pixel unit, 122 represents a green pixel unit, and 123 represents a blue pixel unit.

The antenna layer 10 includes the antenna.

In at least one embodiment of the present disclosure, as shown in FIG. 1, the encapsulation layer includes two inorganic encapsulation layers and an organic encapsulation layer arranged between the two inorganic encapsulation layers.

In at least one embodiment of the present disclosure, as shown in FIG. 1, each pixel unit includes a light-emitting layer, an anode and a Thin Film Transistor (TFT) array layer laminated one on another at a side of the cathode layer 11 away from the encapsulation layer 11.

FIG. 1 is a partial sectional view of the display substrate, and it merely illustratively shows a positional relationship among the antenna, the encapsulation layer, the cathode layer and three pixel units. In actual use, a driving circuit is further arranged between the voltage line E1 and the pixel unit at the display region, and a base substrate is arranged at a side of the pixel unit away from the encapsulation layer. However, the display substrate is not limited thereto.

In at least one embodiment of the present disclosure, the voltage line includes a first voltage line portion, a second voltage line portion, a third voltage line portion and a fourth voltage line portion, the first voltage line portion is arranged at a first side of the display region, the second voltage line portion is arranged at a second side of the display region, the third voltage line portion is arranged at a third side of the display region, the fourth voltage line portion is arranged at a fourth side of the display region, the first side is opposite to the second side, the third side is opposite to the fourth side, the first side is adjacent to the third side, the second side is adjacent to the third side, a driving integrated circuit is arranged at the fourth side of the display region, and the hollowed-out portion is arranged on at least one of the first voltage line portion, the second voltage line portion and the third voltage line portion.

During the implementation, the driving integrated circuit and a signal line for providing a data voltage to the pixel unit at the display region are arranged at the fourth side of the display region. An orthogonal projection of the signal line onto the base substrate at least partially overlaps an orthogonal projection of the fourth voltage line portion onto the base substrate, so when the fourth voltage line portion is provided with the hollowed-out portion and the antenna is arranged correspondingly, the radiation of the antenna is adversely affected by the signal line. Hence, in at least one embodiment of the present disclosure, the fourth voltage line portion is not provided with the hollowed-out portion and no antenna is arranged, and instead, at least one of the first voltage line portion, the second voltage line portion and the third voltage line portion is provided with the hollowed-out portion.

Figure 2:
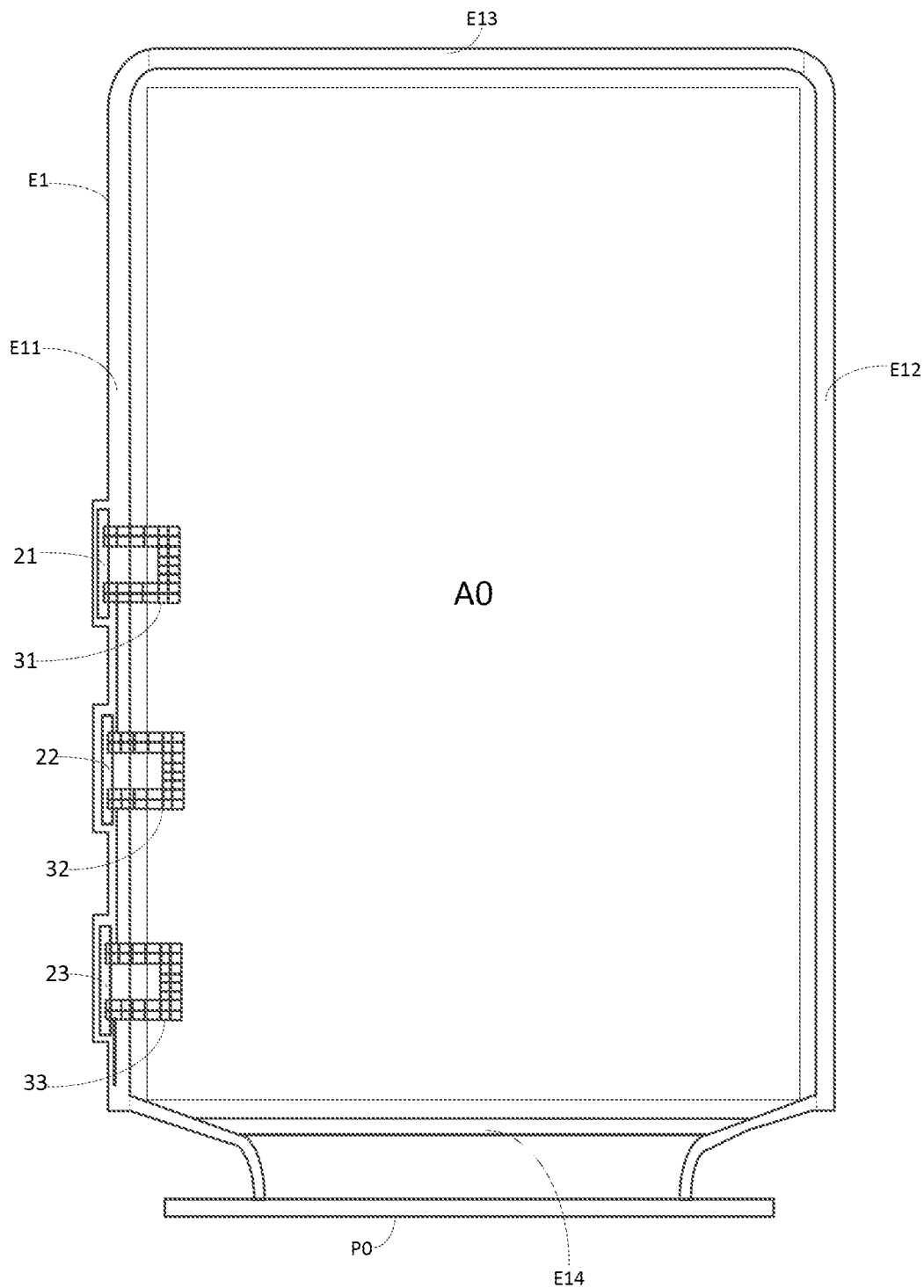
FIG. 2 is a schematic view showing the arrangement of an antenna on a voltage line according to one embodiment of the present disclosure.

In FIG. 2, E1 represents the voltage line, and A0 represents the display region. The voltage line E1 includes a first voltage line portion E11, a second voltage line portion E12, a third voltage line portion E13 and a fourth voltage line portion E14. The first voltage line portion E11 is arranged at a left side of the display region A0, the second voltage line portion E12 is arranged at a right side of the display region A0, the third voltage line portion E13 is arranged at an upper side of the display region A0, and the fourth voltage line portion E14 is arranged at a lower side of the display region A0.

In at least one embodiment of the present disclosure, as shown in FIG. 2, the first voltage line portion E11 is provided with a first hollowed-out portion 21, a second hollowed-out portion 22 and a third hollowed-out portion 23. No conductive material is provided in each of the first hollowed-out portion 21, the second hollowed-out portion 22 and the third hollowed-out portion 23.

In at least one embodiment of the present disclosure, the display substrate includes a first antenna 31, a second antenna 32 and a third antenna 33 which are each a grid-like antenna. An orthogonal projection of an end of the first antenna 31 onto the base substrate is located within an orthogonal projection of the first hollowed-out portion 21 onto the base substrate, an orthogonal projection of an end of the second antenna 32 onto the base substrate is located within an orthogonal projection of the second hollowed-out portion 22 onto the base substrate, and an orthogonal projection of an end of the third antenna 33 onto the base substrate is located within an orthogonal projection of the third hollowed-out portion 23 onto the base substrate.

In FIG. 2, P0 represents a flexible circuit board.

In at least one embodiment of the present disclosure, the hollowed-out portion may also be formed in the second voltage line portion E12 and/or the third voltage line portion E13.

During the implementation, the peripheral region includes a voltage line region and an encapsulation region, the voltage line region is arranged at a side of the encapsulation region adjacent to the display region, and the voltage line is arranged at the voltage line region.

In at least one embodiment of the present disclosure, the voltage line region is arranged between the display region and the encapsulation region.

In a possible embodiment of the present disclosure, the voltage line is a cathode voltage line, and the display substrate includes a first driving circuit region arranged at the first side of the display region and a second driving circuit region arranged at the second side of the display region. The cathode voltage line includes a first cathode voltage line portion, a second cathode voltage line portion, and a third cathode voltage line portion arranged at the third side of the display region. The first cathode voltage line portion is arranged between the encapsulation region and the first driving circuit region, the second cathode voltage line portion is arranged between the encapsulation region and the second driving circuit region, and the hollowed-out portion is arranged on at least one of the first cathode voltage line portion, the second cathode voltage line portion and the third cathode voltage line portion.

Figure 3:
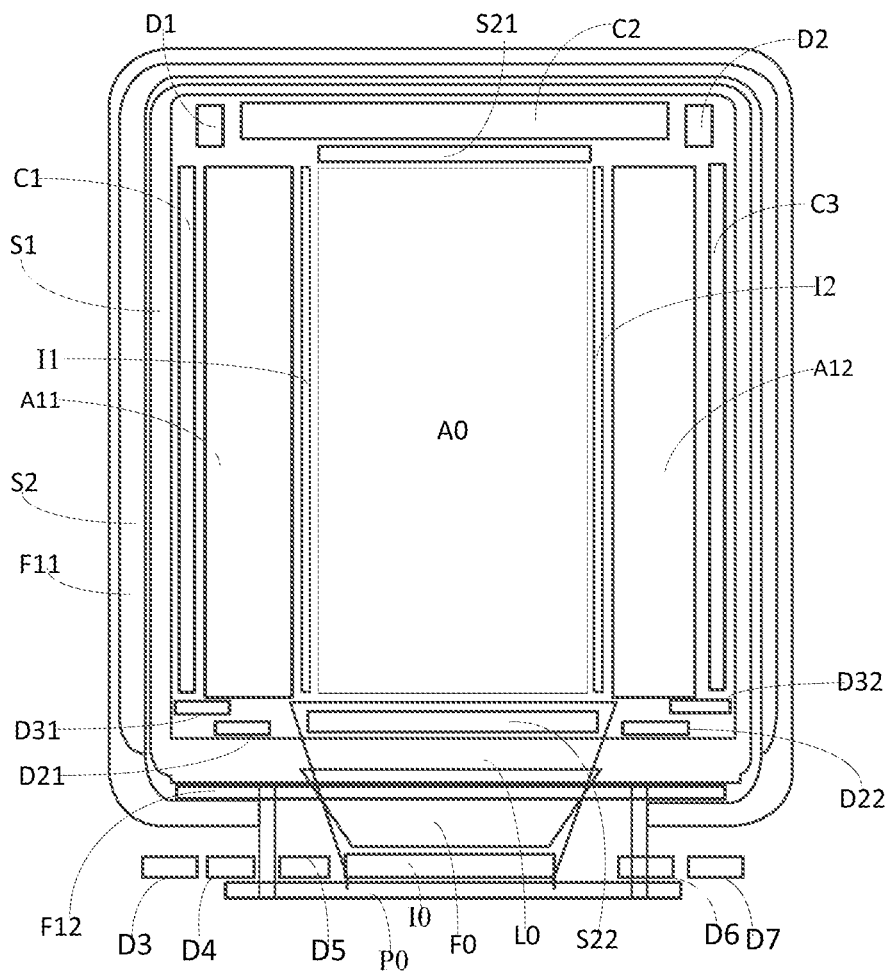
FIG. 3 is a schematic view showing regions of the display substrate according to one embodiment of the present disclosure.

In FIG. 3, A0 represents the display region, A11 represents the first driving circuit region, A12 represents the second driving circuit region, F11 represents a first encapsulation region, F12 represents a second encapsulation region, S1 represents the cathode voltage line, S2 represents an external cathode voltage line, S21 represents a first high voltage line, and S22 represents a second high voltage line. The first driving circuit region A11 is arranged at a left side of the display region A0, the second driving circuit region A12 is arranged at a right side of the display region A0, the first driving circuit region A11 is arranged between the cathode voltage line S1 and the display region A0, the second driving circuit region A12 is arranged between the cathode voltage line S1 and the display region A0, and the first encapsulation region F11 is arranged between the external cathode voltage line S2 and the cathode voltage line S1.

In FIG. 3. C1 represents a first cell-forming test region, C2 represents a second cell-forming test region, C3 represents a third cell-forming test region, D1 represents a first electrostatic protection region, D2 represents a second electrostatic protection region, D3 represents a third electrostatic protection region, D4 represents a fourth electrostatic protection region, D5 represents a fifth electrostatic protection region, D6 represents a sixth electrostatic protection region, D7 represents a seventh electrostatic protection region, F0 represents a data fanout region. D21 represents a first clock electrostatic protection region, D22 represents a second clock electrostatic protection region, D31 represents a first initial electrostatic protection region, D32 represents a second initial electrostatic protection region, L0 represents a signal line region where the signal for providing a data voltage to the pixel unit at the display region is arranged, I1 represents a first initial voltage line, I2 represents a second initial voltage line, I0 represents the driving integrated circuit, and P0 represents the flexible circuit board. The cathode voltage line S1 and the external cathode voltage line S2 are both electrically coupled to the flexible circuit board P0, and the flexible circuit board P0 is configured to provide a corresponding low level signal to the cathode voltage line S1 and the external cathode voltage line S2.

In FIG. 3, a gate driving circuit and a light-emission control signal generation circuit are arranged at the first driving circuit region A11 and the second driving circuit region A12, and the light-emission control signal generation circuit is arranged between the gate driving circuit and the display region A0.

In at least one embodiment of the present disclosure, in order to provide a narrow bezel, a total width of a part between a Gate On Array (GOA) region and the encapsulation region is usually 1 mm to 2 mm, and a width of the cathode voltage line S1 is usually 0.2 mm to 0.3 mm.

In the related art, an OLED screen of a mobile phone usually adopts a top-emission and ultra-narrow bezel design. A majority of the OLED screen is a display region, and a driving circuit region, a cathode voltage line and an encapsulation region are arranged in such a manner as to surround the display region. Various metal layers are arranged under the encapsulation layer of the OLED screen, e.g., a cathode layer, an anode layer, a source-drain metal layer and a gate metal layer are laminated one on another. The anode layer includes two Indium Tin Oxide (ITO) layers and an Argentum (Ag) layer between the two ITO layers. When a thickness of the Ag layer of the anode layer is appropriately increased, the anode layer and the source-drain metal layer coupled to the anode layer may be considered as an entire metal layer having a large thickness (relative to millimeter wave). When the antenna is merely formed on the display region, due to a distance at a 10 μm level between the antenna and the entire metal layer having a large thickness, electromagnetic energy is strongly confined between the antenna and the metal layer, so the radiation efficiency is seriously reduced. In order to increase the radiation efficiency, a series of hollowed-out portions need to be formed in the metal layer. However, the wiring of the circuit for transistors in the pixel units is very complicated, and it is actually meaningless to directly form the hollowed-out portions in the metal layer. Based on the above, in at least one embodiment of the present disclosure, the hollowed-out portion is formed on the voltage line, and regions not shielded by the metal layer are provided above and under the voltage line. In this way, it is able to form the hollowed-out portion on the voltage line conveniently, thereby to increase the radiation efficiency.

In at least one embodiment of the present disclosure, the hollowed-out portion is a rectangular hollowed-out portion, and a first long side and a second long side of the hollowed-out portion extend in an extension direction of the voltage line.

During the implementation, when the hollowed-out portion is formed on the first voltage line portion of the voltage line, the first long side and the second long side of the hollowed-out portion extend in an extension direction of the first voltage line portion. When the hollowed-out portion is formed on the second voltage line portion of the voltage line, the first long side and the second long side of the hollowed-out portion extend in an extension direction of the second voltage line portion. When the hollowed-out portion is formed on the third voltage line portion of the voltage line, the first long side and the second long side of the hollowed-out portion extend in an extension direction of the third voltage line portion.

In at least one embodiment of the present disclosure, an absolute value of a difference between a shortest distance between the orthogonal projection of at least a part of the end of the antenna onto the base substrate and the first long side of the hollowed-out portion and a shortest distance between the orthogonal projection of at least a part of the end of the antenna onto the base substrate and the second long side of the hollowed-out portion is smaller than or equal to a distance difference threshold, so that the orthogonal projection of at least a part of the end of the antenna onto the base substrate is approximately located in the middle of the corresponding hollowed-out portion.

In a possible embodiment of the present disclosure, the distance difference threshold is, but not limited to, greater than or equal to 0 and smaller than or equal to 3 μm.

During the implementation, in order to increase the radiation efficiency of the antenna, the voltage line needs to be provided with the hollowed-out portion having a length greater than or equal to $\lambda/2n$. The length of the hollowed-out portion needs to be greater than or equal to an active half-wavelength, so as to ensure that the energy is transferred through the hollowed-out portion rather than being blocked by the voltage line, i.e., a cutoff wavelength limit of waveguide. A width of the hollowed-out portion may be within a very large range, from 10 microns to hundreds of microns. In at least one embodiment of the present disclosure, a width of each of the first cathode voltage line portion, the second cathode voltage line portion and the third cathode voltage line portion of the cathode voltage line is about 200 μm, so the width of the hollowed-out portion is about 40 μm to 50 μm, so as to prevent the conductivity of the cathode voltage line from being adversely affected severely, and facilitate the formation of the hollowed-out portion.

In at least one embodiment of the present disclosure, the antenna has a plurality of ends, orthogonal projections of the ends onto the base substrate are located within an orthogonal projection of one hollowed-out portion onto the base substrate, and a length of a long side of the hollowed-out portion is greater than or equal to $\lambda/2n$ so as to ensure the radiation efficiency, where $\lambda$ is a wavelength corresponding to a radiation frequency of the antenna, and n is a refractive index of the encapsulation layer.

For example, when the antenna is a U-shaped grid-like antenna, an E-shaped grid-like antenna or a comb-shaped grid-like antenna, the orthogonal projections of the ends of the antenna onto the base substrate are located within the orthogonal projection of one hollowed-out portion onto the base substrate.

In at least one embodiment of the present disclosure, the antenna has N ends, the voltage line has N hollowed-out portions, and an orthogonal projection of an $n^{th}$ end of the N ends onto the base substrate is located within an orthogonal projection of an n hollowed-out portion of the voltage line onto the base substrate, where N is an integer greater than 1, and n is a positive integer smaller than or equal to N. A length of a long side of each hollowed-out portion is greater than or equal to $\lambda/0.2n$, where $\lambda$ is a wavelength corresponding to a radiation frequency of the antenna, and n is a refractive index of the encapsulation layer.

For example, when the antenna is a U-shaped grid-like antenna, an E-shaped grid-like antenna or an L-shaped grid-like antenna, the orthogonal projection of each end of the antenna onto the base substrate is located within the orthogonal projection of the corresponding hollowed-out portion onto the base substrate, but the length of the long side of each hollowed-out portion needs to be greater than or equal to $\lambda/2n$.

In actual use, the orthogonal projection of each end of the antenna onto the base substrate is located in the middle of the long side of the corresponding hollowed-output portion, so as to improve the radiation efficiency.

In at least one embodiment of the present disclosure, the antenna has a plurality of ends, an orthogonal projection of one end in the plurality of ends onto the base substrate is located within an orthogonal projection of one hollowed-out portion onto the base substrate, and a length of a long side of the hollowed-out portion is greater than or equal to $\lambda/2n$, where $\lambda$ is a wavelength corresponding to a radiation frequency of the antenna, and n is a refractive index of the encapsulation layer.

For example, when the antenna is a rectangular grid-like antenna or a T-shaped grid-like antenna, the orthogonal projection of one end of the antenna onto the base substrate is located within the orthogonal projection of one hollowed-out portion onto the base substrate, and the length of the long side of the hollowed-out portion needs to be greater than or equal to $\lambda/2n$.

In at least one embodiment of the present disclosure, the voltage line portion with the hollowed-out portion has a line width of A, and a length of a short side of the hollowed-out portion is smaller than or equal to A/4, so as to reduce the influence on the transmission of a direct-current voltage signal provided by the voltage line.

Figure 4:
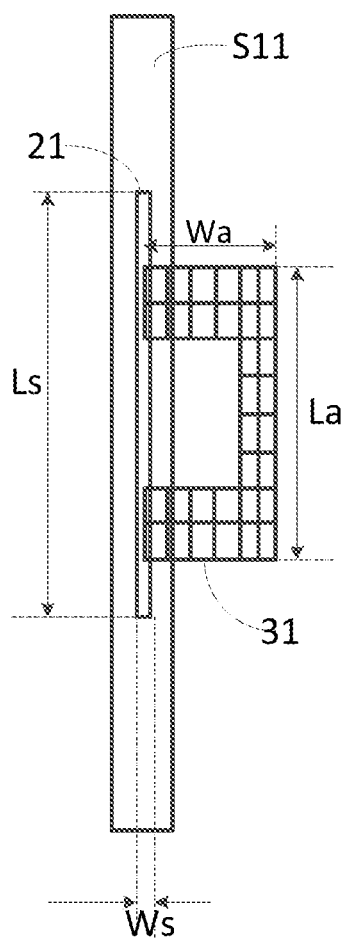
FIG. 4 is a schematic view showing a first cathode voltage line portion and a first antenna in the display substrate according to one embodiment of the present disclosure.

In FIG. 4, S11 represents the first cathode voltage line portion of the cathode voltage line S1, 31 represents a first antenna, and 21 represents a first hollowed-out portion. The first cathode voltage line portion S11 extends in a vertical direction. The first cathode voltage line portion S11 is a U-shaped grid-like antenna, and it includes a first end and a second end. An orthogonal projection of the first end onto the base substrate and an orthogonal projection of the second end onto the base substrate are located within an orthogonal projection of the first hollowed-out portion 21 onto the base substrate.

In FIG. 4, Ls represents a length of the first hollowed-out portion 21 in the vertical direction, Ws represents a width of the first hollowed-out portion 21 in a horizontal direction, Ls is greater than or equal to $\lambda/2n$, $\lambda$ is a vacuum wavelength corresponding to a radiation frequency of the antenna, n is a refractive index of the encapsulation layer (during the manufacture of the display substrate, the encapsulation layer falls into the hollowed-out portion), Ws is greater than or equal to 40 m and smaller than or equal to 50 m, Wa represents a length of the first antenna 31 in the vertical direction, and La represents a width of the first antenna 31 in the vertical direction.

In at least one embodiment of the present disclosure, as shown in FIG. 4, La and Wa may be optimized through simulation in accordance with actual radiation or a reception wave band. Usually, a numerical range of La and a numerical value of Wa may be adjusted flexibly. For the encapsulation layer having a radiation frequency of 27 GHz and an dielectric constant of 3. La is greater than or equal to 0.5 mm and smaller than or equal to 2.5 mm, and Wa is greater than or equal to 1 mm and smaller than or equal to 3 mm.

In at least one embodiment of the present disclosure, a stun of La and Wa is about $\lambda/n_{eff}$, where $n_{eff}$ is an ambient refractive index, i.e., an overall refractive index of organic layers and inorganic layers of the display substrate between the antenna and the base substrate (e.g., the encapsulation layer, a light-emitting medium layer of a light-emitting element in the pixel unit, an insulation layer, and so on).

In at least one embodiment of the present disclosure, the first cathode voltage line portion S1 is provided with two hollowed-out portions, an orthogonal projection of a first end of the first antenna 31 onto the base substrate is located within an orthogonal projection of one hollowed-out portion onto the base substrate, an orthogonal projection of a second end of the first antenna 31 onto the base substrate is located within an orthogonal projection of another hollowed-out portion onto the base substrate, and a length of a long side of each hollowed-out portion needs to be greater than or equal to $\lambda/2n$, so as to ensure the radiation efficiency.

Figure 5:
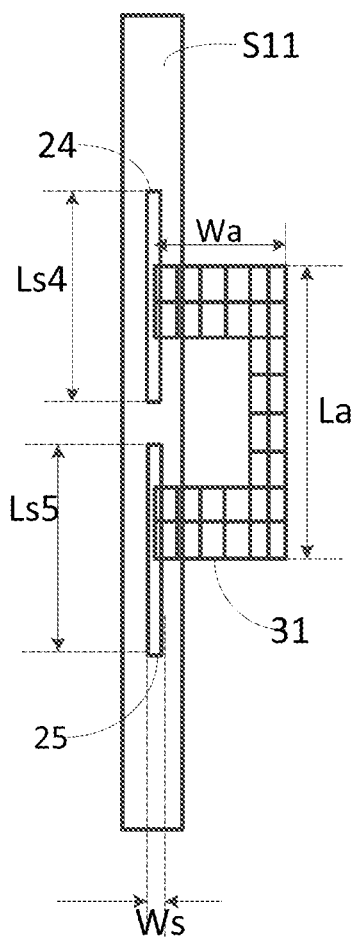
FIG. 5 is a schematic view showing the first cathode voltage line portion and the first antenna according to one embodiment of the present disclosure.

FIG. 5 differs from FIG. 4 in that the first cathode voltage line portion S11 is provided with a fourth hollowed-out portion 24 and a fifth hollowed-out portion 25. The orthogonal projection of the first end of the first antenna 31 onto the base substrate is located within an orthogonal projection of the fourth hollowed-out portion 24 onto the base substrate, and the orthogonal projection of the second end of the first antenna 31 onto the base substrate is located within an orthogonal projection of the fifth hollowed-out portion 25 onto the base substrate. Ls4 represents a length of the fourth hollowed-out portion 24 in the vertical direction, Ls5 represents a length of the fifth hollowed-out portion 25 in the vertical direction, and Ls4 and Ls5 are both greater than or equal to $\lambda/2n$.

It should be appreciated that, usually the cathode voltage line having a width of 0.2 mm is provided with a hollowed-out portion having a width of 40 μm in and a length of several millimeters. At this time, although a square resistance of the cathode voltage line increases, a low level signal transmitted via the cathode voltage line may not be interfered obviously due to an increased value of the square resistance. However, when a plurality of antennae is to be formed, the cathode voltage line needs to be provided with a plurality of hollowed-out portions. At this time, the increased value of the square resistance of the cathode voltage line is relatively large, and the width or thickness of the cathode voltage line needs to be compensated.

In a possible embodiment of the present disclosure, the voltage line portion with the hollowed-out portion has an equal line width, so as to compensate for the width of the voltage line portion. A width, a shape or an arrangement mode of a compensation region may be set in accordance with an electromagnetic simulation result, so as to reduce a change in the square resistance of the voltage line before and after the formation of the hollowed-out portion as possible while satisfying the requirement on a narrow bezel.

In at least one embodiment of the present disclosure, the hollowed-out portion extends in a first direction, a second direction and a third direction are perpendicular to the first direction, the second direction is opposite to the third direction, and the voltage line portion is provided with a first protrusion protruding toward the second direction, so as to enable the voltage line with the hollowed-out portion to have an equal line width, thereby to compensate for the width of the voltage line portion.

During the implementation, the first direction is an extension direction of the voltage line portion. For example, the first direction is, but not limited to, the vertical direction, the second direction is, but not limited to, a horizontal right-to-left direction, and the third direction is, but not limited to, a horizontal left-to-right direction.

In at least one embodiment of the present disclosure, the hollowed-out portion extends in a first direction, a second direction and a third direction are perpendicular to the first direction, the second direction is opposite to the third direction, and the voltage line portion is provided with a second protrusion protruding toward the third direction, so as to enable the voltage line with the hollowed-out portion to have an equal line width, thereby to compensate for the width of the voltage line portion.

In at least one embodiment of the present disclosure, the hollowed-out portion extends in a first direction, a second direction and a third direction are perpendicular to the first direction, the second direction is opposite to the third direction, and the voltage line portion is provided with a first protrusion protruding toward the second direction and a second protrusion protruding toward the third direction, so as to enable the voltage line with the hollowed-out portion to have an equal line width, thereby to compensate for the width of the voltage line portion.

During the implementation, the voltage line is provided with a plurality of hollowed-out portions, and at this time, a thickness of the voltage line is greater than a thickness of the line when the hollowed-out portions are not formed, so as to compensate for an increased value of the resistance of the voltage line after the hollowed-out portions have been formed.

In a possible embodiment of the present disclosure, the voltage line is, but not limited to, a cathode voltage line.

Figure 6:
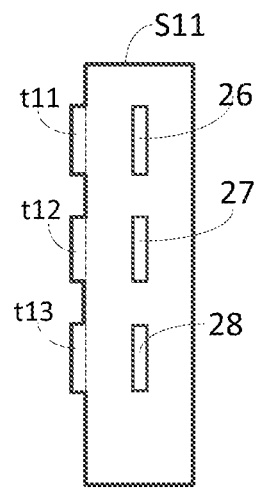
FIGS. 6, 7 and 8 are schematic views showing the compensation for a width of the first cathode voltage line portion when the first cathode voltage line portion is provided with a sixth hollowed-out portion, a seventh hollowed-out portion and an eighth hollowed-out portion.
Figure 7:
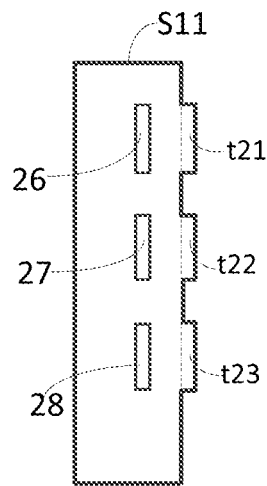
Figure 8:
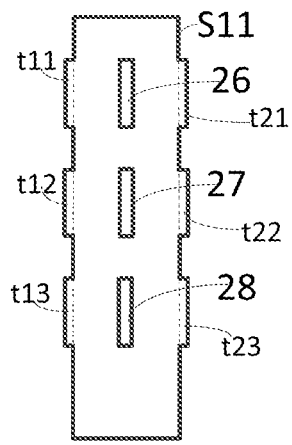

As shown in FIGS. 6, 7 and 8, when the first cathode voltage line portion S11 is provided with a sixth hollowed-out portion 26, a seventh hollowed-out portion 27 and an eighth hollowed-out portion 28, a width of the first cathode voltage line portion S11 is compensated. A width, a shape or an arrangement mode of a compensation region may be set in accordance with an electromagnetic simulation result, so as to reduce a change in a square resistance of the cathode voltage line before and after the formation of the hollowed-out portion as possible while satisfying the requirement on a narrow bezel.

In FIGS. 6, 7 and 8, the first direction is an extension direction of the first cathode voltage line S11. The first direction is, but not limited to, the vertical direction, the second direction is, but not limited to, a horizontal right-to-left direction, and the third direction is, but not limited to, a horizontal left-to-right direction.

As shown in FIG. 6, the width of the first cathode voltage line portion S11 is compensated at a left side of the first cathode voltage line portion S11, so that the first cathode voltage line portion S11 has an equal line width. In FIG. 6, t11 represents a first one of the first protrusions, t12 represents a second one of the first protrusions, and t13 represents a third one of the first protrusion. The three first protrusions t11, t12 and t13 protrude toward the horizontal right-to-left direction.

As shown in FIG. 7, the width of the first cathode voltage line portion S11 is compensated at a right side of the first cathode voltage line portion S11, so that the first cathode voltage line portion S11 has an equal line width. In FIG. 7, t21 represents a first one of the second protrusions, t22 represents a second one of the second protrusions, and t23 represents a third one of the second protrusion. The three second protrusions t21, t22 and t23 protrude toward the horizontal left-to-right direction.

As shown in FIG. 8, the width of the first cathode voltage line portion S11 is compensated at a right side and a left side of the first cathode voltage line portion S11, so that the first cathode voltage line portion S11 has an equal line width. In FIG. 8, t11 represents a first one of the first protrusions, t12 represents a second one of the first protrusions, t13 represents a third one of the first protrusion, t21 represents a first one of the second protrusions, t22 represents a second one of the second protrusions, and t23 represents a third one of the second protrusion. The three first protrusions t11, t12 and t13 protrude toward the horizontal right-to-left direction, and the three second protrusions t21, t22 and t23 protrude toward the horizontal left-to-right direction.

Figure 9:
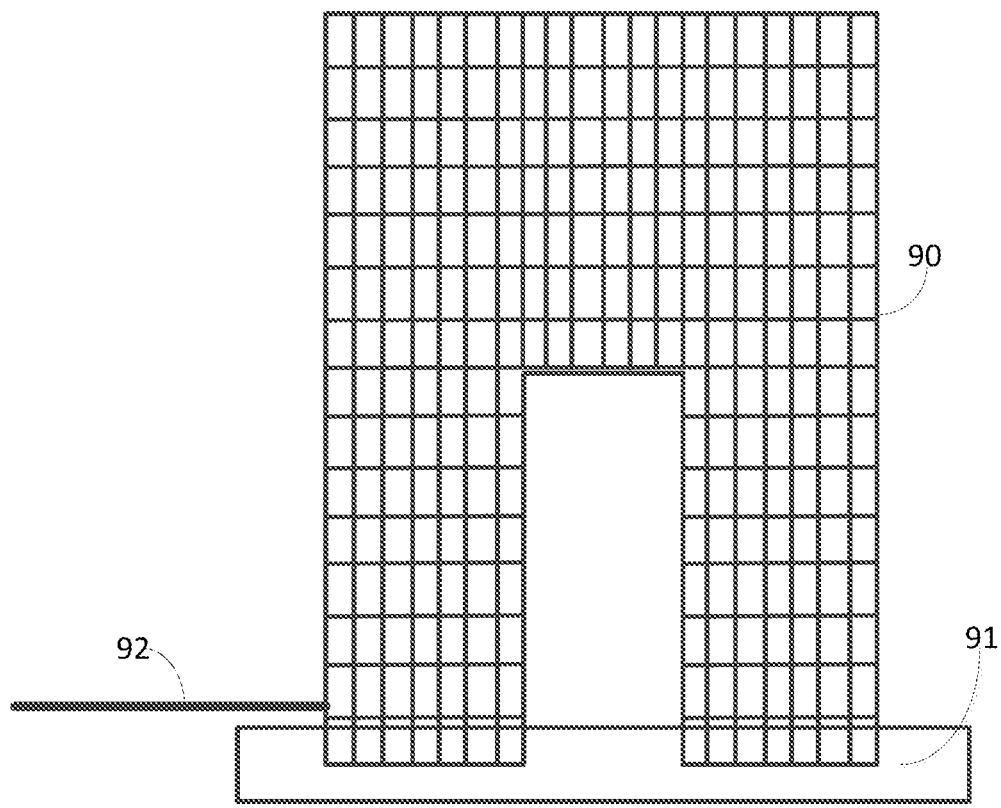
FIG. 9 is a schematic view showing a grid-like antenna with a large grid density.
Figure 10:
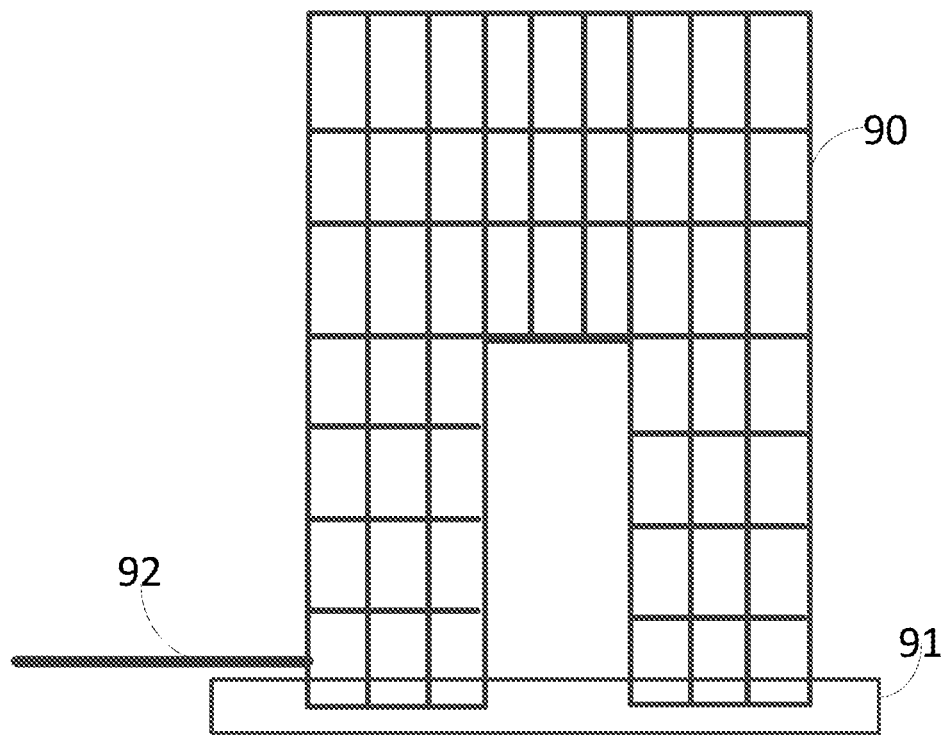
FIG. 10 is a schematic view showing a grid-like antenna with a small grid density.

During the implementation, in order to enable the grid-like antenna to have the maximum radiation efficiency at an operating frequency band, the grid-like antenna needs to operate at a second-order model at the operating frequency band, i.e., a quadripole mode. As shown in FIG. 9, when the grid-like antenna 90 has a large grid density, a resonance electric field between the grid-like antenna 90 and the mental ground is distributed evenly, and at a frequency band where the radiation efficiency increases remarkably, the Z-direction resonance electric field between the grid-like antenna 90 and the ground is distributed in the quadripole mode. As shown in FIG. 10, when the grid-like antenna 90 has a small grid density, the electric field between the grid-like antenna 90 and the ground is distributed unevenly and mainly along a metal line, but still generally distributed in the quadripole mode. In an arrangement mode of the grid-like antenna 90 with the largest grid density, each pixel unit is arranged in each grid.

In FIGS. 9 and 10, 91 represents the hollowed-out portion in the cathode voltage line, and 92 represents a feeder line.

In at least one embodiment of the present disclosure, an arrangement mode of the grid-like antenna with the smallest grid density needs to be determined in accordance with the electromagnetic simulation result and it is not particularly defined, as long as an approximate quadripole resonance mode is ensured. In this second-order mode, the radiation efficiency of the grid-like antenna when the cathode voltage line is provided with the hollowed-out portion is higher than, by 15 times or more, than the radiation efficiency when the cathode voltage line is not provided with the hollowed-out portion.

In at least one embodiment of the present disclosure, as shown in FIGS. 9 and 10, the grid-like antenna 90 is a U-shaped grid-like antenna.

Figure 11:
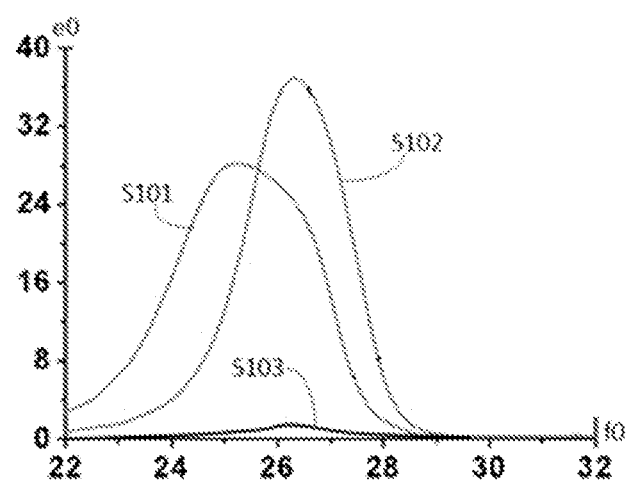
FIG. 11 is a frequency-efficiency curve diagram of antennae.

In FIG. 11, S101 represents a first frequency-efficiency curve, S102 represents a second frequency-efficiency curve, S103 represents a third frequency-efficiency curve, an X-axis represents the radiation frequency $f0$ in unit of GHz, and a Y-axis represents the radiation efficiency $e0$ in the form of percentage.

In FIG. 11, the first frequency-efficiency curve S101 shows the relationship between the radiation frequency and the radiation efficiency when the voltage line is provided with the hollowed-out portion having a width of 40 μm in and the antenna is a U-shaped grid-like antenna, the second frequency-efficiency curve S102 shows the relationship between the radiation frequency and the radiation efficiency when the voltage line is provided with the hollowed-out portion having a width of 40 μm in and the antenna is a U-shaped non-grid antenna, and the third frequency-efficiency curve S103 shows the relationship between the radiation frequency and the radiation efficiency when the voltage line is not provided with any hollowed-out portion and the antenna is a U-shaped antenna. The encapsulation layer having a thickness of 10 μm is arranged between the antenna and the voltage line.

As shown in FIG. 11, the radiation efficiency of the antenna when the voltage line is provided with the hollowed-out portion is far greater than that of the antenna when the voltage line is not provided with any hollowed-out portion.

In at least one embodiment of the present disclosure, the orthogonal projection of the grid-like antenna onto the base substrate does not cover an orthogonal projection of the pixel unit at the display region onto the base substrate, so as to prevent a display effect from being adversely affected.

In a possible embodiment of the present disclosure, the plurality of pixel units in the display substrate is arranged in an array form, the display substrate further includes a plurality of gate lines and a plurality of data lines arranged at the display region of the base substrate, each gate line extends in a first direction, and each data line extends in a second direction. Two pixel units closest to each other in two rows of pixel units are arranged in the second direction, and the antenna is a U-shaped antenna or an E-shaped antenna; or the two pixel units closest to each other in two rows of pixel units are arranged in a third direction different from the second direction and the first direction, and the antenna is a chamfered diamond antenna.

When the antenna is an E-shaped antenna, orthogonal projections of all ends of the E-shaped antenna onto the base substrate are, but not limited to, located within the orthogonal projection of one hollowed-out portion onto the base substrate.

During the implementation, the first direction is a horizontal direction, and the second direction is a vertical direction. When a distance between the adjacent pixel units of the display substrate is maximum in both the horizontal direction and the vertical direction, i.e., the two closest pixel units in the pixel units in two adjacent rows are arranged in the vertical direction, the U-shaped antenna where a metal line extends in the horizontal direction and the vertical direction is formed appropriately.

When the distance between the adjacent pixel units of the display substrate is maximum in an oblique direction (e.g., when the pixel units are arranged in a diamond form), i.e., when the two closest pixel units in the pixel units in two adjacent rows are arranged in the third direction (the third direction is not the horizontal direction or the vertical direction), the chamfered diamond antenna is formed appropriately.

Figure 12A:
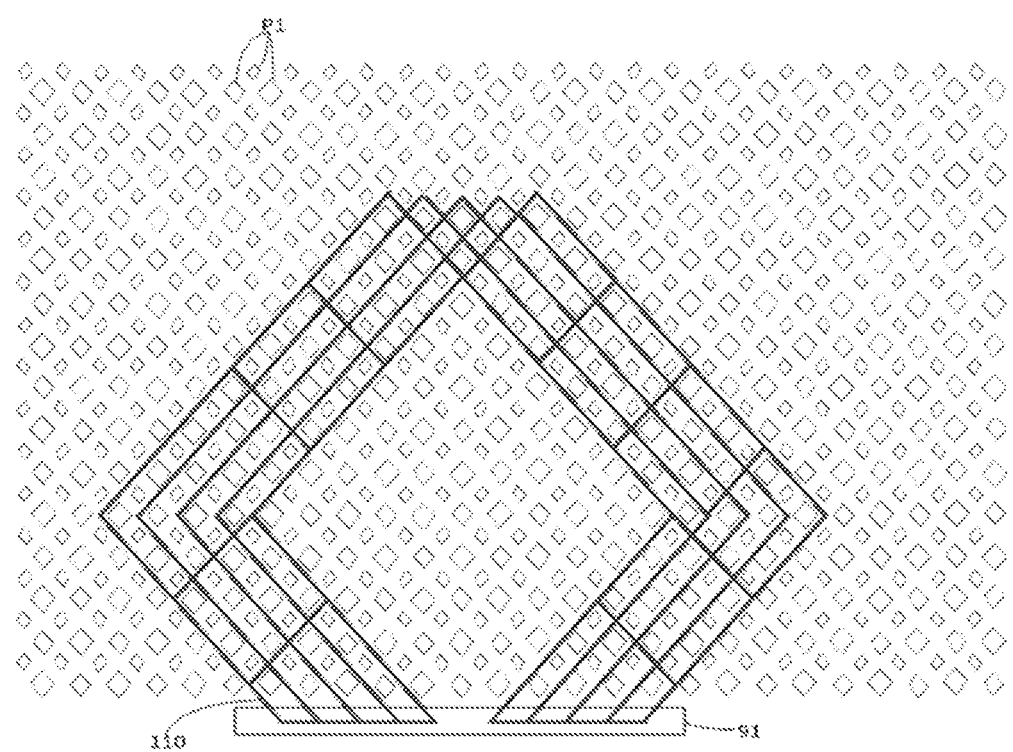
FIG. 12A is a schematic view showing a chamfered diamond antenna in the display substrate according to one embodiment of the present disclosure.

In FIG. 12A, 110 represents the chamfered diamond antenna, and a sum of lengths of four sides of the chamfered diamond antenna 110 is also about $\lambda/n_{eff}$, where $n_{eff}$ represents the ambient refractive index, and $\lambda$ represents the vacuum wavelength of the radiation frequency of the antenna. 91 represents the hollowed-out portion, and P1 represents the pixel unit.

As shown in FIG. 12A, the length of the long side of the hollowed-out portion 91 needs to be greater than or equal to $\lambda/2n$, so as to ensure the radiation efficiency.

Figure 12B:
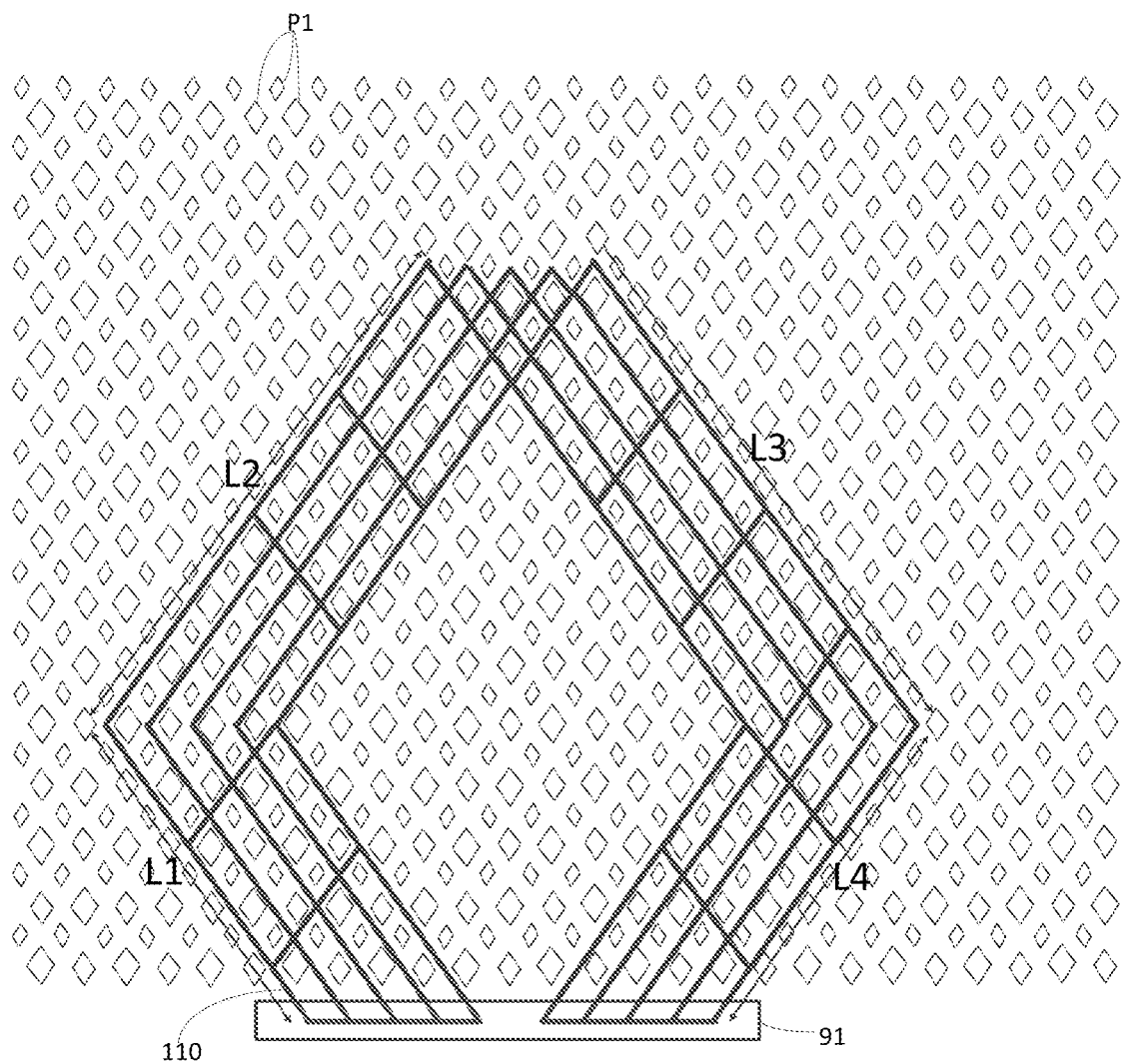
FIG. 12B is a schematic view showing the chamfered diamond antenna in FIG. 12A with marks L1, L2, L3 and L4.

On the basis of FIG. 12A, in FIG. 12B, L1 represents a length of a first side of the chamfered diamond antenna. L2 represents a length of a second side of the chamfered diamond antenna, L3 represents a length of a third side of the chamfered diamond antenna, L4 represents a length of a fourth side of the chamfered diamond antenna, and a sum of L1, L2, L3 and L4 are approximately equal to $\lambda/n_{eff}$.

In a possible embodiment of the present disclosure, the antenna is an L-shaped antenna, the antenna includes a first end and a second end, the voltage line is provided with a first hollowed-portion and a second hollowed-out portion, an orthogonal projection of the first end onto the base substrate is located within an orthogonal projection of the first hollowed-out portion onto the base substrate, an orthogonal projection of the second end onto the base substrate is located within an orthogonal projection of the second hollowed-out portion onto the base substrate, and the first hollowed-out portion and the second hollowed-out portion are arranged at two adjacent sides of the voltage line respectively.

Figure 13A:
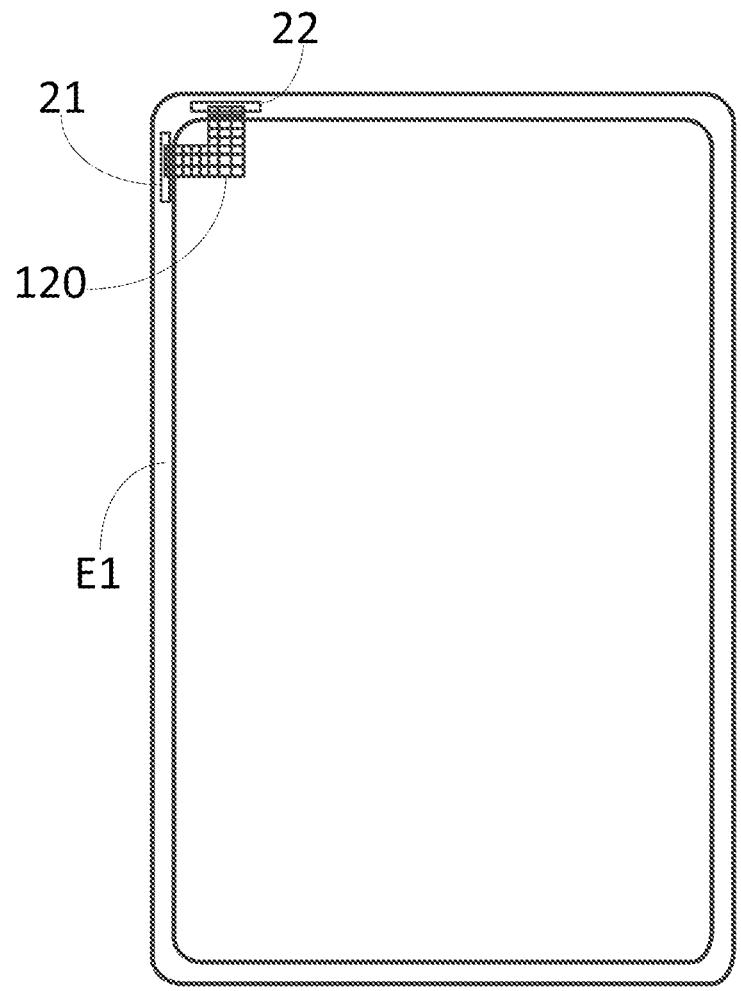
FIG. 13A is a schematic view showing an L-shaped grid-like antenna in the display substrate according to one embodiment of the present disclosure.

In at least one embodiment of the present disclosure, as shown in FIG. 13A, the antenna 120 includes two ends, the orthogonal projection of the first end of the antenna 120 onto the base substrate is located within the orthogonal projection of the first hollowed-out portion 21 onto the base substrate, the orthogonal projection of the second end of the antenna 120 onto the base substrate is located within the orthogonal projection of the second hollowed-out portion 22 onto the base substrate, and the first hollowed-out portion 21 and the second hollowed-out portion 22 are arranged at a left side and an upper side of the voltage line E1.

The antenna 120 is an L-shaped grid-like antenna, and a sum of two right-angle sides of the antenna 120 is approximately equal to $\lambda/n_{eff}$ or $\lambda/(2n_{eff})$, where $n_{eff}$ represents the ambient refractive index, and $\lambda$ represents the vacuum wavelength of the radiation frequency of the antenna.

In at least one embodiment of the present disclosure, as shown in FIG. 13A, the length of the long side of the first hollowed-out portion 21 needs to be greater than or equal to $\lambda/2n$, and length of the long side of the second hollowed-out portion 22 needs to be greater than or equal to $\lambda/2n$, so as to ensure the radiation frequency.

Figure 13B:
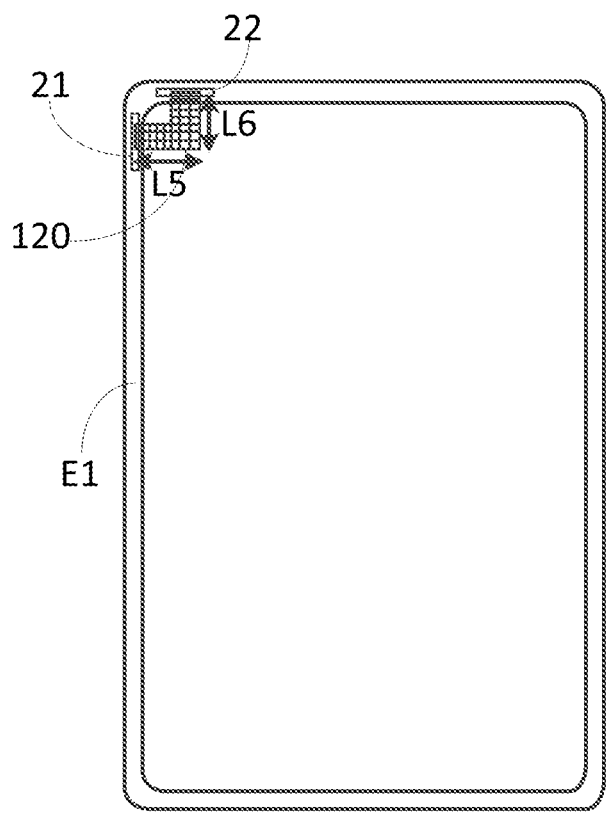
FIG. 13B is a schematic view showing the L-shaped grid-like antenna in FIG. 13A with marks L5 and L6.

On the basis of FIG. 13A, as shown in FIG. 13B, L5 represents a length of a first right-angle side of the antenna 120, L6 represents a length of a second right-angle side of the antenna 120, and a sum of L5 and L6 is approximately equal to $\lambda/n_{eff}$ or $\lambda/(2n_{eff})$.

During the implementation, when the antenna is arranged at a corner of the voltage line, the antenna may be of an L-shaped structure, and the L-shaped antenna may operate in a fundamental mode (when the radiation frequency of the antenna is 30 GHz in an environment having a dielectric constant of 3, a total length of the L-shaped antenna is about 3 mm) or in a second-order mode (when the radiation frequency of the antenna is 30 GHz in an environment having a dielectric constant of 3, a total length of the L-shaped antenna is about 6 mm), or in a higher-order mode.

In a possible embodiment of the present disclosure, the antenna is a rectangular or T-shaped antenna, the voltage line is provided with a first hollowed-out portion, and an orthogonal projection of one end of the antenna onto the base substrate is located within an orthogonal projection of the first hollowed-out portion onto the base substrate.

In at least one embodiment of the present disclosure, the hollowed-out portion is provided for a single end of the antenna, and the radiation efficiency of the antenna is slightly low but still far greater than that of the antenna when the voltage line is not provided with any hollowed-out portion. At this time, the antenna for which the hollowed-out portion is provided operates, but not limited to, in the fundamental mode.

Figure 14:
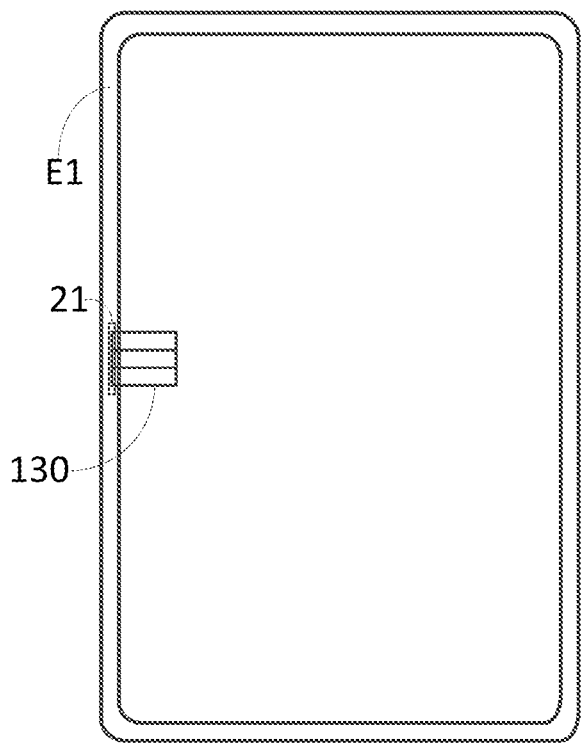
FIG. 14 is a schematic view showing a rectangular grid-like antenna in the display substrate according to one embodiment of the present disclosure.

In at least one embodiment of the present disclosure, as shown in FIG. 14, the antenna 130 includes two ends. An orthogonal projection of a first end of the antenna 130 onto the base substrate is located within the orthogonal projection of the first hollowed-out portion 21 onto the base substrate. The antenna 130 is a rectangular grid-like antenna, and a length of a side of the antenna 130 perpendicular to the long side of the first hollowed-out portion 21 is approximately equal to $\lambda/(2n_{eff})$, where $n_{eff}$ represents the ambient refractive index and $\lambda$ represents the vacuum wavelength of the radiation frequency of the antenna. When the radiation frequency of the antenna is 30 GHz in an environment having a dielectric constant of 3, the length of the side of the antenna 130 perpendicular to the long side of the first hollowed-out portion 21 is 2 mm to 3 mm, and a specific size of the antenna needs to be designed through simulation in accordance with the grid density, the shape of the grid and a position of the orthogonal projection of the end of the antenna in the hollowed-out portion.

In at least one embodiment of the present disclosure, as shown in FIG. 14, the length of the long side of the first hollowed-out portion 21 needs to be greater than or equal to λ/2n, so as to ensure the radiation efficiency.

In at least one embodiment of the present disclosure, as shown in FIG. 14, each grid of the antenna 130 is of an elongated rectangular shape. During the implementation, the grid of the antenna 130 may also be of a small square shape or rectangular shape.

Figure 15A:
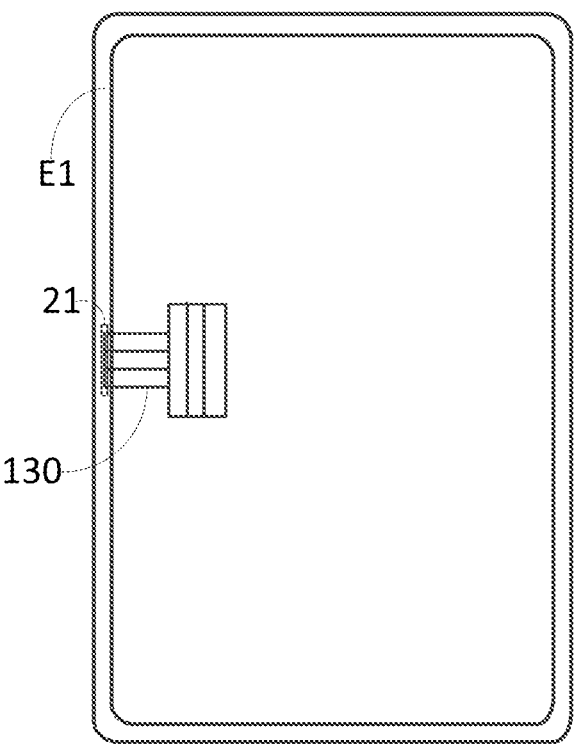
FIG. 15A is a schematic view showing a T-shaped grid-like antenna in the display substrate according to one embodiment of the present disclosure.

In at least one embodiment of the present disclosure, as shown in FIG. 15A, an antenna 140 includes three antennae, an orthogonal projection of a first end of the antenna 140 onto the base substrate is located within the orthogonal projection of the first hollowed-out portion 21 onto the base substrate. The antenna 140 is a T-shaped grid-like antenna.

In at least one embodiment of the present disclosure, as shown in FIG. 15A, the length of the long side of the first hollowed-out portion 21 needs to be greater than or equal to λ/2n, so as to ensure the radiation efficiency.

Figure 15B:
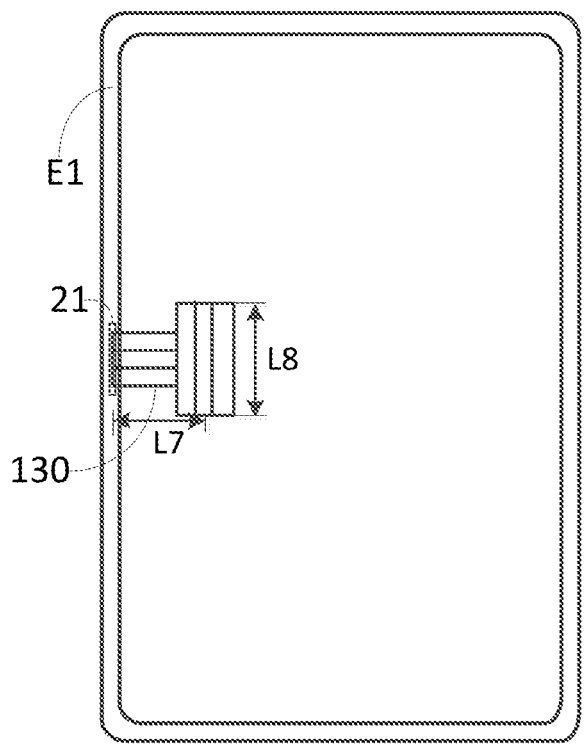
FIG. 15B is a schematic view showing the T-shaped grid-like antenna in FIG. 15A with marks L7 and L5.

On the basis of FIG. 15A, in FIG. 15B, L7 represents a first length, L8 represents a second length, and a sum of L7 and L8/2 is approximately equal to $\lambda/(2n_{eff})$ or $\lambda/(n_{eff})$, where $n_{eff}$ represents the ambient refractive index, and λ represents the vacuum wavelength of the radiation frequency of the antenna.

In at least one embodiment of the present disclosure, as shown in FIGS. 15A and 15B, the antenna 140 may be considered as a combination of two L-shaped antennae.

In at least one embodiment of the present disclosure, as shown in FIGS. 15A and 15B, each grid of the antenna is of an elongated rectangular shape. During the implementation, the grid of the antenna 140 may also be of a small square shape or rectangular shape.

In FIGS. 14, 15A and 15B, E1 represents the voltage line.

In at least one embodiment of the present disclosure, the antenna is not limited to be U-shaped, E-shaped, rectangular, T-shaped, chamfered diamond and L-shaped as mentioned hereinabove. In actual use, the shape of the antenna may be selected according to the practical need, e.g., a comb-like shape.

In at least one embodiment of the present disclosure, the display substrate further includes a touch layer arranged at a side of the encapsulation layer away from the base substrate, the antenna is arranged at a side of the touch layer away from the encapsulation layer, the display substrate further includes an insulation layer arranged between the touch layer and the antenna, and an orthogonal projection of the insulation layer onto the base substrate covers an orthogonal projection of the antenna onto the base substrate.

During the implementation, the antenna and the touch layer are integrated in a space above the encapsulation layer, and the antenna may intersect a line at the touch layer. The antenna may be arranged at a side of the touch layer away from the encapsulation layer, and the insulation layer may be arranged between the antenna and the touch layer. When the antenna extends across the display region, the driving circuit region and the voltage line, the antenna may intersect a peripheral line coupled to the touch layer. At this time, through the insulation layer between the antenna and the touch layer, the peripheral line may extend above the antenna.

In a possible embodiment of the present disclosure, the insulation layer has a thickness of, but not limited to, about 5 μm.

In a possible embodiment of the present disclosure, the touch layer includes a plurality of touch units arranged in rows and columns, the touch units are provided with a plurality of touch signal lines, a touch signal line in a touch unit in the plurality of touch units overlapping the antenna has a line width greater than that of a touch signal line in the plurality of touch units not overlapping the antenna, and the quantity of breaking points in the touch signal line in the touch unit in the plurality of touch units overlapping the antenna is smaller than the quantity of breaking points in the touch signal line in the plurality of touch units not overlapping the antenna.

During the implementation, the touch unit overlapping the antenna needs to be compensated, i.e., a line width of the touch signal line in the touch unit overlapping the antenna needs to be increased, so as to reduce a resistance of the touch signal line, and appropriately reduce the quantity of breaking points in the touch signal line in the touch unit overlapping the antenna.

Figure 16:
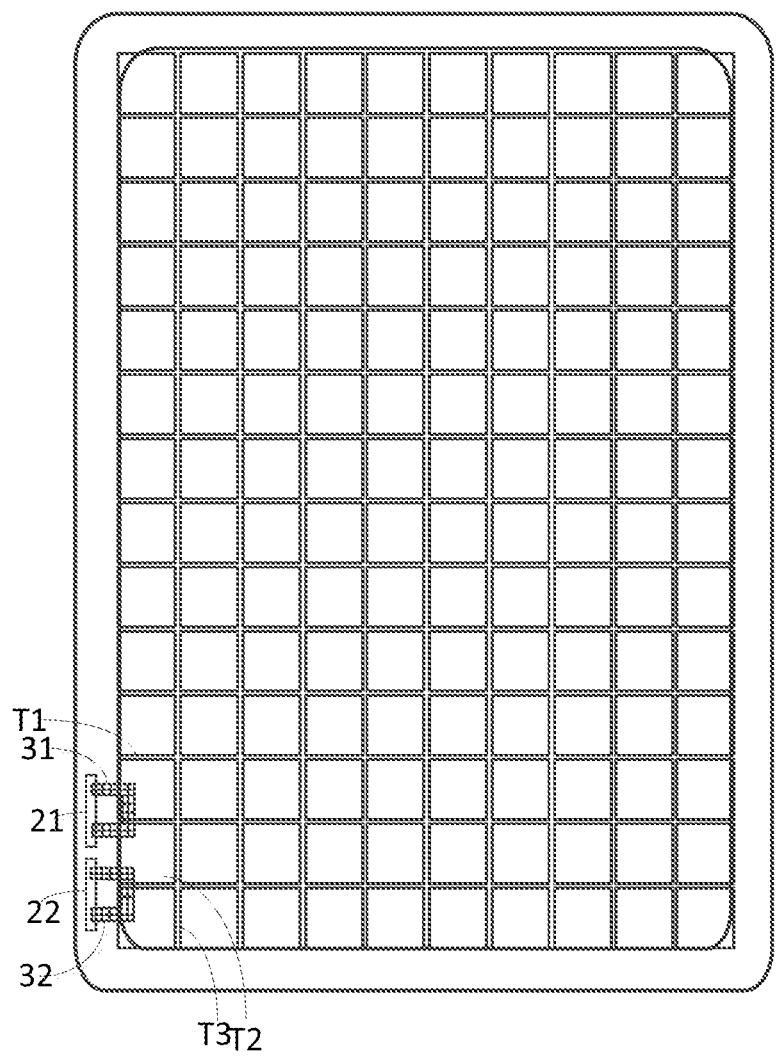
FIG. 16 is a schematic view showing a positional relationship between a touch layer and the antenna in the display substrate according to one embodiment of the present disclosure.

As shown in FIG. 16, the touch layer includes a plurality of touch units arrange din rows and columns. A first antenna 31 overlaps a first touch unit T1 and a second touch unit T2, and a second antenna 32 overlaps the second touch unit T2 and a third touch unit T3.

Here, a line width of a metal line in the first touch unit T1, a line width of a metal line in the second touch unit T2 and a line width of a metal line in the third touch unit T3 need to be increased appropriately, so as to reduce a resistance of each metal line, and reduce the quantity of breaking points in the metal lines in the first touch unit T1, the second touch unit T2 and the third touch unit T3.

In FIG. 16, 21 represents the first hollowed-out portion, and 22 represents the second hollowed-out portion.

The present disclosure further provides in some embodiments a method for manufacturing the above-mentioned display substrate, which includes: forming a plurality of pixel units at a display region of a base substrate, and forming a voltage line at a peripheral region of the base substrate, the voltage line being provided with a hollowed-out portion; forming an encapsulation layer at a side of the voltage line away from the base substrate; and directly forming a grid-like antenna at a side of the encapsulation layer away from the base substrate in such a manner that an orthogonal projection of at least a part of an end of the grid-like antenna onto the base substrate is located within an orthogonal projection of the hollowed-out portion onto the base substrate.

In the related art, the antenna is formed through a thin film bonding process, so it is impossible to achieve accurate alignment. However, in the method according to the embodiments of the present disclosure, the grid-like antenna is directly formed at a side of the encapsulation layer away from the base substrate, so as to achieve the accurate alignment, thereby to flexibly form an antenna array in a compact arrangement mode.

In the related art, an on-screen antenna needs to be formed on a flexible thin film, and then the flexible thin film is attached onto a display screen, so a thickness of the display screen is increased by more than one hundred millimeters, which is adverse to the formation of a light, thin and flexible display screen. According to the display substrate and its manufacture method in the embodiments of the present disclosure, the thickness of the display screen is not increased substantially, so it is able to provide a light and thin display screen, and prevent the bending of the display screen from being adversely affected.

In at least one embodiment of the present disclosure, the grid-like antenna is formed through a semiconductor photoetching process.

In a possible embodiment of the present disclosure, the voltage line includes a first voltage line portion, a second voltage line portion, a third voltage line portion and a fourth voltage line portion. The first voltage line portion is arranged at a first side of the display region, the second voltage line portion is arranged at a second side of the display region, the third voltage line portion is arranged at a third side of the display region, and the fourth voltage line portion is arranged at a fourth side of the display region. The first side is opposite to the second side, the third side is opposite to the fourth side, the first side is adjacent to the third side, the second side is adjacent to the third side, and a driving integrated circuit is arranged at the fourth side of the display region. The forming the hollowed-out portion in the voltage line includes forming the hollowed-out portion on at least one of the first voltage line portion, the second voltage line portion and the third voltage line portion.

Subsequent to forming the encapsulation layer at a side of the voltage line away from the base substrate and prior to directly forming the grid-like antenna at a side of the encapsulation layer away from the base substrate, the method further includes: forming a touch layer at a side of the encapsulation layer away from the base substrate; and forming an insulation layer at a side of the touch layer away from the encapsulation layer in such a manner that an orthogonal projection of the insulation layer onto the base substrate covers an orthogonal projection of the grid-like antenna onto the base substrate.

The present disclosure further provides in some embodiments a display device including the above-mentioned display substrate.

The display device may be any product or member having a display function. e.g., mobile phone, tablet computer, television, display, laptop computer, digital photo frame or navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate, a voltage line arranged at a peripheral region of the base substrate, an encapsulation layer arranged at a side of the voltage line away from the base substrate, and a plurality of pixel units arranged at a display region of the base substrate, wherein the encapsulation layer is arranged at the peripheral region and the display region of the base substrate,
the display substrate further comprises an antenna arranged at a side of the encapsulation layer away from the base substrate, the antenna is a grid-like antenna,
the voltage line is provided with a hollowed-out portion, and
an orthogonal projection of at least a part of an end of the antenna onto the base substrate is located within an orthogonal projection of the hollowed-out portion onto the base substrate,
the display substrate further comprises a touch layer arranged at a side of the encapsulation layer away from the base substrate,
wherein the antenna is arranged at a side of the touch layer away from the encapsulation layer, the display substrate further comprises an insulation layer arranged between the touch layer and the antenna, and an orthogonal projection of the insulation layer onto the base substrate covers an orthogonal projection of the antenna onto the base substrate.

2. The display substrate according to claim 1, wherein the voltage line comprises a first voltage line portion, a second voltage line portion, a third voltage line portion and a fourth voltage line portion, the first voltage line portion is arranged at a first side of the display region, the second voltage line portion is arranged at a second side of the display region, the third voltage line portion is arranged at a third side of the display region, the fourth voltage line portion is arranged at a fourth side of the display region,
the first side is opposite to the second side, the third side is opposite to the fourth side, the first side is adjacent to the third side, the second side is adjacent to the third side, a driving integrated circuit is arranged at the fourth side of the display region, and
the hollowed-out portion is arranged on at least one of the first voltage line portion, the second voltage line portion and the third voltage line portion.

3. The display substrate according to claim 2, wherein the peripheral region comprises a voltage line region and an encapsulation region, the voltage line region is arranged at a side of the encapsulation region adjacent to the display region, the voltage line is arranged at the voltage line region,
the voltage line is a cathode voltage line, the display substrate comprises a first driving circuit region arranged at the first side of the display region and a second driving circuit region arranged at the second side of the display region,
the cathode voltage line comprises a first cathode voltage line portion, a second cathode voltage line portion, and a third cathode voltage line portion arranged at the third side of the display region,
the first cathode voltage line portion is arranged between the encapsulation region and the first driving circuit region, the second cathode voltage line portion is arranged between the encapsulation region and the second driving circuit region, and
the hollowed-out portion is arranged on at least one of the first cathode voltage line portion, the second cathode voltage line portion and the third cathode voltage line portion.

4. The display substrate according to claim 2, wherein the hollowed-out portion is a rectangular hollowed-out portion, and a first long side and a second long side of the hollowed-out portion extend in an extension direction of the voltage line.

5. The display substrate according to claim 4, wherein an absolute value of a difference between a shortest distance between the orthogonal projection of at least a part of the end of the antenna onto the base substrate and the first long side of the hollowed-out portion and a shortest distance between the orthogonal projection of at least a part of the end of the antenna onto the base substrate and the second long side of the hollowed-out portion is smaller than or equal to a distance difference threshold, and
the distance difference threshold is greater than or equal to 0 and smaller than or equal to 3 μm.

6. The display substrate according to claim 4, wherein the antenna has a plurality of ends, orthogonal projections of the plurality of ends onto the base substrate are located within an orthogonal projection of one hollowed-out portion onto the base substrate, and a length of a long side of the hollowed-out portion is greater than or equal to $\lambda/2n$, where $\lambda$ is a wavelength corresponding to a radiation frequency of the antenna, and n is a refractive index of the encapsulation layer.

7. The display substrate according to claim 4, wherein the antenna has N ends, the voltage line has N hollowed-out portions, and an orthogonal projection of an $n^{th}$ end of the N ends onto the base substrate is located within an orthogonal projection of an $n^{th}$ hollowed-out portion of the voltage line onto the base substrate, wherein N is an integer greater than 1, and n is a positive integer smaller than or equal to N, wherein a length of a long side of each hollowed-out portion is greater than or equal to $\lambda/2n$, where $\lambda$ is a wavelength corresponding to a radiation frequency of the antenna, and n is a refractive index of the encapsulation layer.

8. The display substrate according to claim 4, wherein the antenna has a plurality of ends, an orthogonal projection of one end in the plurality of ends onto the base substrate is located within an orthogonal projection of one hollowed-out portion onto the base substrate, and a length of a long side of the hollowed-out portion is greater than or equal to $\lambda/2n$, where $\lambda$ is a wavelength corresponding to a radiation frequency of the antenna, and n is a refractive index of the encapsulation layer.

9. The display substrate according to claim 4, wherein the voltage line with the hollowed-out portion has an equal line width.

10. The display substrate according to claim 9, wherein the hollowed-out portion extends in a first direction, a second direction and a third direction are perpendicular to the first direction, the second direction is opposite to the third direction, and the voltage line is provided with a first protrusion protruding toward the second direction so that the voltage line with the hollowed-out portion has an equal line width.

11. The display substrate according to claim 9, wherein the hollowed-out portion extends in a first direction, a second direction and a third direction are perpendicular to the first direction, the second direction is opposite to the third direction, and the voltage line is provided with a second protrusion protruding toward the third direction so that the voltage line with the hollowed-out portion has an equal line width.

12. The display substrate according to claim 9, wherein the hollowed-out portion extends in a first direction, a second direction and a third direction are perpendicular to the first direction, the second direction is opposite to the third direction, and the voltage line is provided with a first protrusion protruding toward the second direction and a second protrusion protruding toward the third direction so that the voltage line with the hollowed-out portion has an equal line width.

13. The display substrate according to claim 9, wherein the voltage line with the hollowed-out portion has a line width of A, and a length of a short side of the hollowed-out portion is smaller than or equal to A/4.

14. The display substrate according to claim 1, wherein the plurality of pixel units in the display substrate is arranged in an array form, the display substrate further comprises a plurality of gate lines and a plurality of data lines arranged at the display region of the base substrate, each gate line extends in a first direction, and each data line extends in a second direction, wherein two pixel units closest to each other in two rows of pixel units are arranged in the second direction, and the antenna is a U-shaped antenna or an E-shaped antenna; or the two pixel units closest to each other in two rows of pixel units are arranged in a third direction different from the second direction and the first direction, and the antenna is a chamfered diamond antenna.

15. The display substrate according to claim 1, wherein the antenna is an L-shaped antenna, the antenna comprises a first end and a second end, the voltage line is provided with a first hollowed-portion and a second hollowed-out portion, an orthogonal projection of the first end onto the base substrate is located within an orthogonal projection of the first hollowed-out portion onto the base substrate, an orthogonal projection of the second end onto the base substrate is located within an orthogonal projection of the second hollowed-out portion onto the base substrate, and the first hollowed-out portion and the second hollowed-out portion are arranged at two adjacent sides of the voltage line respectively.

16. The display substrate according to claim 1, wherein the antenna is a rectangular or T-shaped antenna, the voltage line is provided with a first hollowed-out portion, and an orthogonal projection of one end of the antenna onto the base substrate is located within an orthogonal projection of the first hollowed-out portion onto the base substrate.

17. The display substrate according to claim 1, wherein the touch layer comprises a plurality of touch units arranged in rows and columns, the touch units are provided with a plurality of touch signal lines, a touch signal line in a touch unit overlapping the antenna in the plurality of touch units has a line width greater than a line width of a touch signal line in a touch unit not overlapping the antenna in the plurality of touch units, and a quantity of breaking points in the touch signal line in the touch unit overlapping the antenna in the plurality of touch units is smaller than a quantity of breaking points in the touch signal line in the touch unit not overlapping the antenna in the plurality of touch units.

18. A method for manufacturing the display substrate according to claim 1, comprising:

forming a plurality of pixel units at a display region of a base substrate, and forming a voltage line at a peripheral region of the base substrate, the voltage line being provided with a hollowed-out portion;

forming an encapsulation layer at a side of the voltage line away from the base substrate; and directly forming a grid-like antenna at a side of the encapsulation layer away from the base substrate in such a manner that an orthogonal projection of at least a part of an end of the grid-like antenna onto the base substrate is located within an orthogonal projection of the hollowed-out portion onto the base substrate.

19. A display device, comprising the display substrate according to claim 1.

* * * * *